United States Patent [19]

Knight

[11] Patent Number: 4,915,636

[45] Date of Patent: Apr. 10, 1990

[54] CARD GUIDE WITH ELECTRICAL CONTACTS

[75] Inventor: Donald L. Knight, Alexandria, Va.

[73] Assignee: Dynatech Labs, Inc., Chantilly, Va.

[21] Appl. No.: 224,173

[22] Filed: Jul. 25, 1988

[51] Int. Cl.⁴ .............................................. H05K 1/00
[52] U.S. Cl. ..................................... 439/65; 439/637; 439/630; 439/746
[58] Field of Search ....................... 439/55, 59, 61, 62, 439/65–67, 78, 80–83, 629–637, 676, 344, 733, 744, 746, 747, 748

[56] References Cited

U.S. PATENT DOCUMENTS

| | | | |
|---|---|---|---|
| 3,646,504 | 2/1972 | Classon | 439/637 |
| 4,186,988 | 2/1980 | Kobler | 439/676 |
| 4,193,108 | 3/1980 | Romano | 439/637 |
| 4,664,458 | 5/1987 | Worth | 439/82 |
| 4,780,095 | 10/1988 | Classon et al. | 439/637 |

FOREIGN PATENT DOCUMENTS 2458281 6/1976 Fed. Rep. of Germany ........ 439/78
1001569 8/1965 United Kingdom .................. 439/65

*Primary Examiner*—David Pirlot
*Attorney, Agent, or Firm*—Lowe, Price, LeBlanc, Becker & Shur

[57] ABSTRACT

Disclosed is an electrical card guide or edge connector for mechanically and electrically connecting two printed circuit boards. The connector has an elongated body with an insertion slot at the top for receiving a circuit board and having mechanical snap-type fasteners at the bottom for mechanically securing the connector to a base board. Cross slots are provided in the connector body to receive contacts which are exposed in their mounted positions but which lie within the peripheral profile of the connector body in its fastened position. The contacts are configured with a U-shaped base portion permitting the contacts to be assembled by lateral movement onto the connector body for automatic locking action to secure the contacts into assembled position. The profile of the connector body has a height lower than its width. Pins are provided for locking the mechanical fasteners.

6 Claims, 4 Drawing Sheets

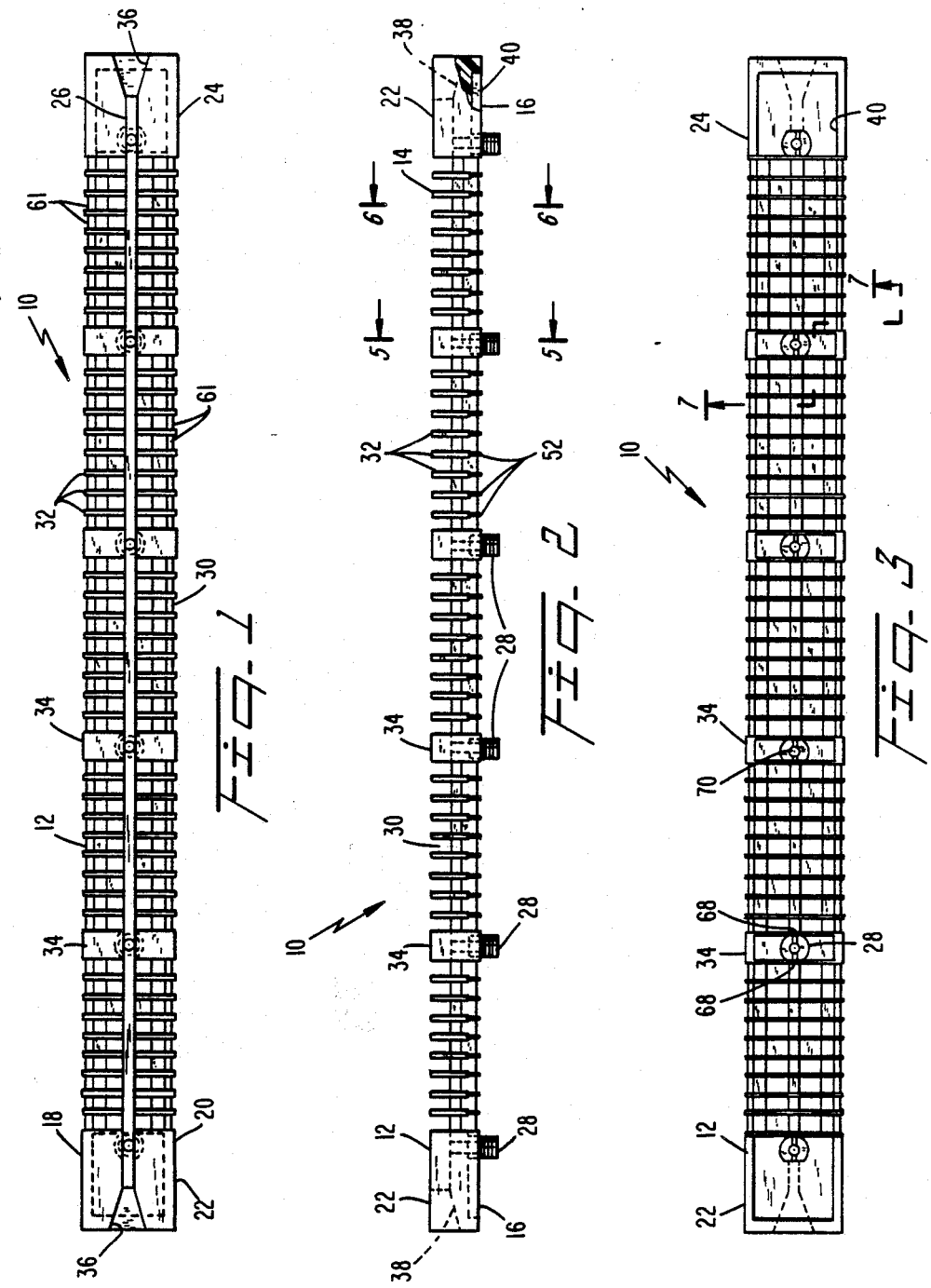

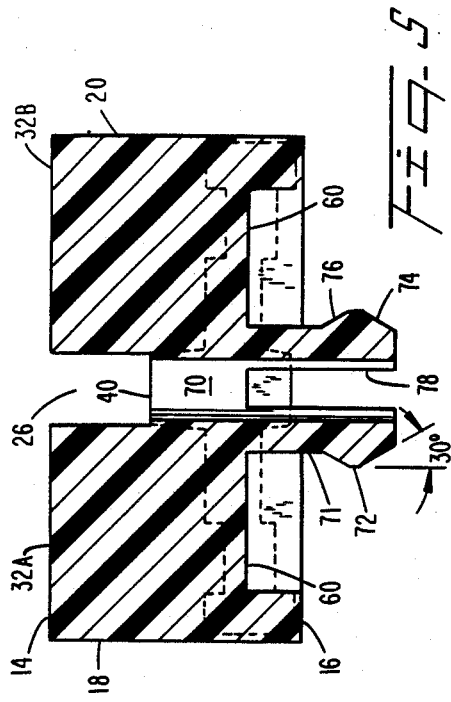
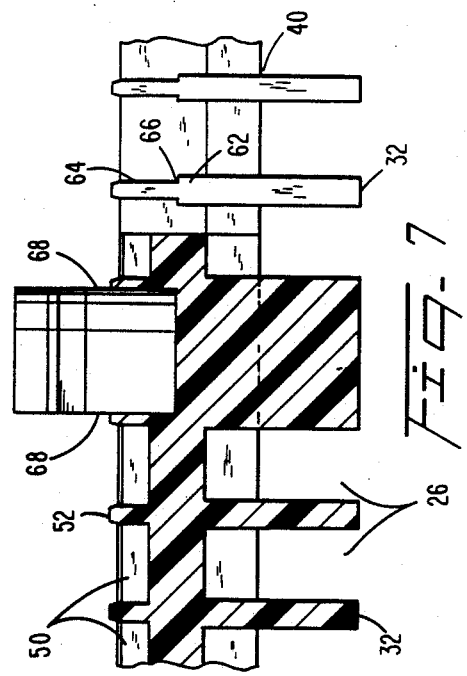
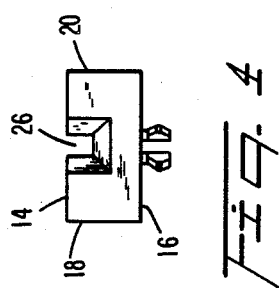
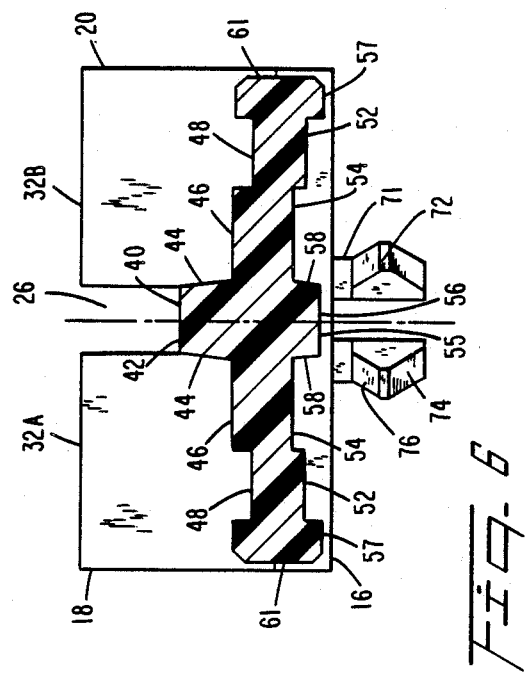

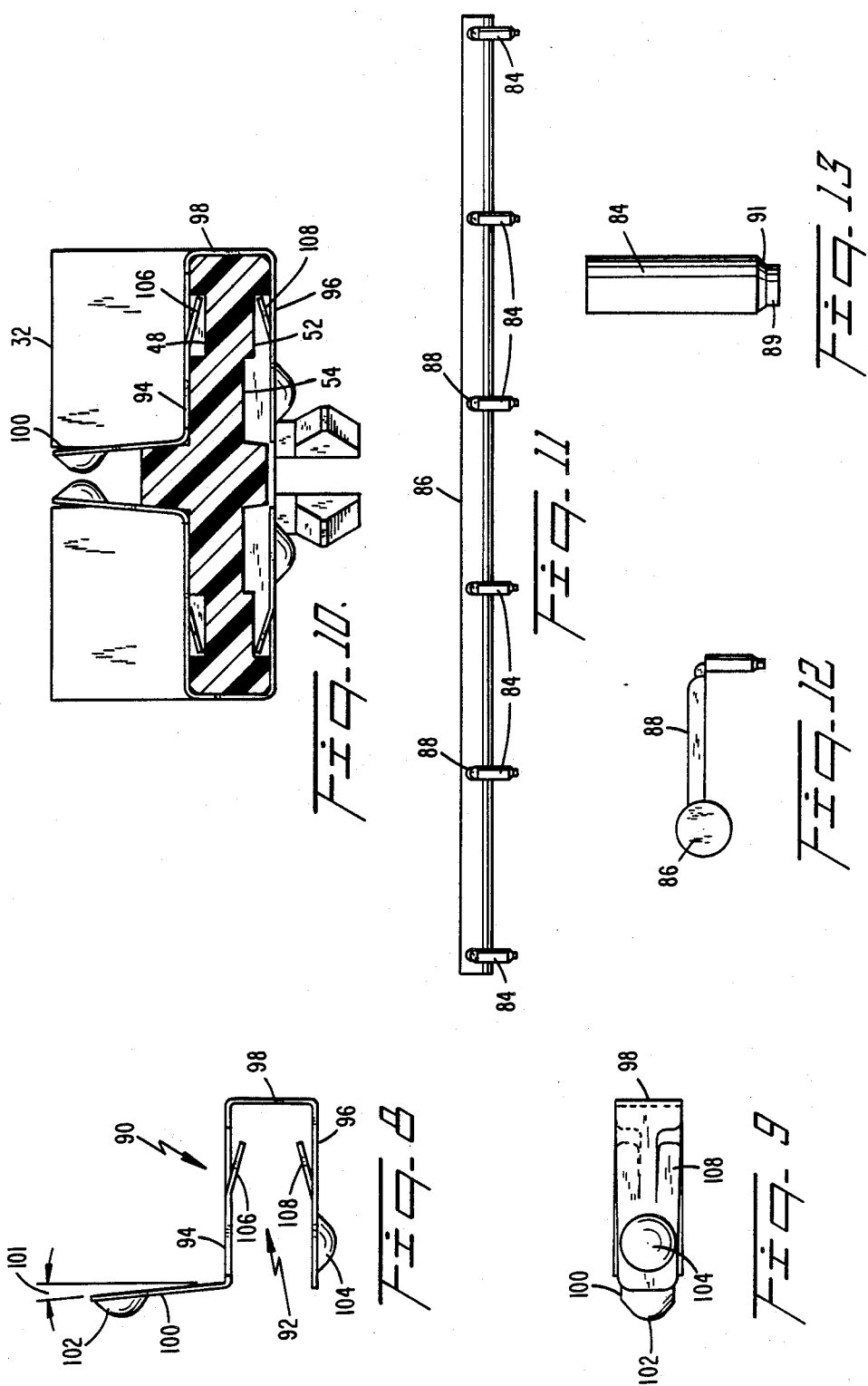

CARD GUIDE WITH ELECTRICAL CONTACTS

BACKGROUND OF THE INVENTION

1. Field Of The Invention

The present invention relates to an electrical card guide or connector for interconnecting printed circuit boards.

2. Description Of The Related Art

The connection of printed circuit boards at right angles using edge connectors is well known and extensively used in many applications. One common practice involves the use of an edge connector mounted on the main, busplane or mother board and connected to it by soldering. The other printed circuit board (PCB) or card, having printed strip connectors is inserted into an insertion slot in the connector so that the companion board or modular PCB is both mechanically and electrically connected to the busplane, main or mother board.

In other arrangements non-soldered contacts are embedded in the connector housing for engagement with mating contact pads on the busplane or mother board. In still other arrangements the connector housing may carry contacts which are mounted therein by friction fits. Usually the contacts are virtually completely housed or enclosed within the connector body. Usually speaking the manufacturing procedures necessary to manufacture such housings and assemble the contacts therein provide less than optimal simplicity, efficiency and cost effectiveness.

In the digital patching and switching equipment sector space and packaging limitations frequently present difficult problems with height being a major consideration. These space problems are usually dictated by various style industry standard connectors to allow cabling to the equipment. Once the connector style is determined and mounted on the rear of the equipment for cable access from other equipment, the designer is left with the problem of providing a means of making numerous electrical connections. Since the equipment chassis design normally uses as many modular plug-in PCB's as possible, accommodating the electrical connections in the remaining space can be physically difficult.

One possible arrangement for coping with these problems is to mount industry standard connectors on each modular plug-in PCB and provide so-called Zero Insertion Force card connectors along the bottom or top of the chassis on a busplane PCB to accommodate the additional electrical traces needed. This may be satisfactory if sufficient space is available within the chassis but frequently is not acceptable for two reasons; first, the height of the Zero Insertion Connector may be excessive as compared to the vertical space remaining; secondly, the connector incorporates a cam lever or slide that must be physically actuated by hand to close the connector contact points onto corresponding contact points on the modular PCB's. Access to these cam levers or slides within the equipment chassis itself becomes a problem which is further compounded when the chassis is mounted in a rack cabinet with other equipment chassis mounted above and below.

Brief Description Of The Invention

According to the present invention there is provided a card guide and contact device in the form of an elongated connector body having an insertion slot at the top for receiving a modular PCB and having fasteners at the bottom for engagement with openings in the busplane or mother board to mechanically secure the connector to the busplane board. Cross slots are provided in the connector body to receive contacts which are exposed in their mounted positions but which lie within the peripheral profile of the connector body in its fastened position. The contacts are so configured as to be laterally movable onto the connector body for automatic locking action to secure the contacts into assembled position. The manufacture of the connector body and contacts and the assembly of the contacts to the body are simple, straightforward and economical and require no special machinery. The contacts may be mounted on the connector body and the connector may be fastened to the busplane PCB by simple hand operations. The profile of the connector body has a height lower than its width to permit efficient use of available space.

According to the invention the electrical contacts for the card guide or connector are provided with a U-shaped base portion and an upstanding contact arm extending from the end of one leg of the U-shaped base portion. The connector is provided with a PCB insertion slot in addition to cross slots and the contacts are mounted on the body of the connector with the upstanding contact arms disposed in the open cross slots which extend across the body generally perpendicular to the insertion slot. The upstanding contact arms extend into the cross slots in free standing fashion for making contact with conductors on a PCB inserted into the insertion slot. The legs of the U-shaped portions of the contacts are provided with fingers or barbs which extend toward the bight of the U. These fingers or barbs engage in recesses in the connector body to lock the contacts into position by snap-action as the contacts are assembled to the connector body by laterally moving the contacts onto the connector. The connector body in turn is attached to the busplane or mother board with snap-type fasteners which automatically detent into position when the connector is pressed into position on the busplane board. Pins are provided for fitting into openings in the snap-type fasteners to lock the same in position.

A connector constructed to the invention permits the use of a low profile of height which provides a significant space saving in comparison to previously used interconnection methods.

It is an object of the present invention to provide a card guide or connector which produces a strong mechanical mounting and provides reliable electrical contacts between a modular PCB and a busplane PCB.

It is a further object of the invention to provide an elongated card connector of low profile having contacts mounted thereon in such a manner as to permit economical and efficient manufacture and assembly.

These and further objects and advantages of the invention will become more apparent upon reference to the following specification, claims and drawings.

BRIEF DESCRIPTION OF THE DRAWINGS

FIG. 1 is a plan view of an elongated connector or card guide body constructed according to the invention;

FIG. 2 is a side elevation of the connector body of FIG. 1;

FIG. 3 is a bottom view of the connector body of FIG. 1;

FIG. 4 is an end elevation of the connector body of FIGS. 1-3;

FIG. 5 is a cross-sectional elevation of the connector body of FIGS. 1-3 taken along the lines 5—5 of FIG. 2;

FIG. 6 is a cross-sectional elevation of the connector body of FIGS. 1-3 taken along the line 6—6 of FIG. 2;

FIG. 7 is a broken partial cross-sectional elevation of the inverted connector body of FIG. 3 taken along the line 7—7 of FIG. 3;

FIG. 8 is a side elevation of a contact of the connector of the invention showing the dome contact points and locking fingers or barbs;

FIG. 9 is a bottom view of the contact of FIG. 8;

FIG. 10 is a cross-sectional elevational view of the connector body of FIGS. 1-3 showing contacts of the type illustrated in FIGS. 8 and 9 mounted thereon;

FIG. 11 is a side elevation of a fastener pin runner or carrier assembly for positioning and inserting fastener pins into locking positions in the mounted connector;

FIG. 12 is an end elevation of the fastener pin runner or carrier assembly;

FIG. 13 is a detail elevation of a fastener pin removed from the fastener pin runner or carrier assembly;

DETAILED DESCRIPTION OF THE PREFERRED EMBODIMENTS

Figure 14:
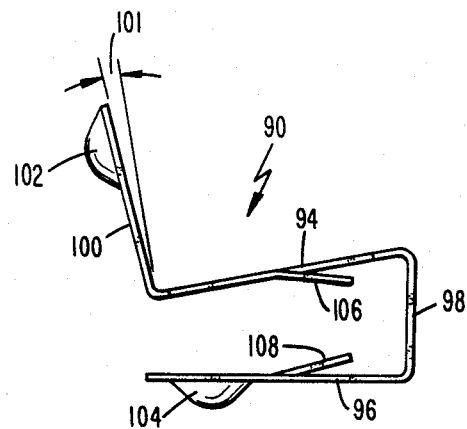
FIG. 14 is a side elevation of another embodiment of a contact.

Referring to FIGS. 1-3 there is seen an elongated card guide or connector indicated generally at 10. The connector 10 comprises a unitary molded synthetic resin body 12 which is shown in end elevation in FIG. 4. The card guide body 12 has an outer profile defined by parallel top and bottom surfaces indicated at 14 and 16 in FIGS. 2 and 4 and perpendicular sides or side surfaces 18 and 20 indicated in FIGS. 1, 3 and 4. By way of example the body 12 may be 0.250 inches high, 0.50 inches wide and 6.0 inches long. In this particular embodiment the connector has a height which is one half of its width. The body ends 22 and 24 have outer end surfaces which are generally rectangular as seen in FIG. 4.

The top connector body surface 12 has a card insertion slot 26 running down the center of the connector to accept and guide by side entry a modular plug-in PCB. By way of example the slot may be 0.07 inches wide and 0.10 inches deep. The bottom 16 of the connector carries six depending snap-type fasteners 28. These fasteners may be spaced apart five equal spaces which may be for example 1.022 inches. The fasteners 28 secure the card guide or connector to a busplane or mother board PCB and/or equipment chassis which by way of example may be 0.031 inches in thickness for the PCB and 0.062 inches for the chassis.

The elongated card guide or connector 10 in the illustrated example is provided with 45 individual dual cross slots 30 extending perpendicular to the longitudinal axis and top, bottom and side surfaces 14, 16, 18 and 20 of the card guide or connector body. The slots are referred to as dual slots which are illustrated because the perpendicular insertion slot 26 separates the cross slots into pairs or dual slots. It will be understood that use of such terms as top, bottom, side, upper, lower, vertical, horizontal and the like are relative to the preferred embody illustrated in the drawings. The connector is not limited to usage in the illustrated position but may be used in other positions as will be clear to those skilled in the art. Such terminology is thus to be understood as illustrative and not restrictive in nature.

The 45 dual cross slots which are illustrated are arranged in five segments with each segment containing nine dual positions. The slots may be 0.072 inches wide on 0.100 centerline spacings with 0.028 inch upper separators 32 therebetween as an example. The five sets of cross slots and separators are separated by four intermediate body portions 34. These may be by way of example 0.150 inches wide along the longitudinal axis of the connector body. Four of the six snap-type fasteners 28 are arranged on the bottom surfaces of the intermediate body portions 34. The ends of the insertion slot 26 terminate in outwardly flared portions 36 having downwardly inclined floors 38. The underside of the connector ends 22 are recessed as shown at 40 in FIGS. 2 and 3. Referring to FIG. 5, the intermediate portions 34 may be provided at their under surfaces with recesses 60. The connector body thus may be provided in shell-like or hollow form with savings in weight and material.

Referring to FIGS. 5, 6, and 7 it will be seen that the cross slots 26 define dual upper separators shown at 32A and 32B in FIGS. 5 and 6 separated by the insertion slot 26. The insertion slot 26 is of a lesser depth than the slots between the upper separators 32 to provide a longitudinal rib 40 at the bottom of the insertion slot as shown in FIGS. 5-7. The rib 40 has an upper surface 42 and depending side walls 44. The side walls 44 extend downwardly to the cross slot floors 46. Each cross slot floor 46 is provided with a recess 48 for positively locking a contact in assembled position as will be explained.

The bottom surface 16 of the card guide 10 is defined by the lower surfaces of the ends 22 and intermediate portions 34. The bottom surface between the intermediate portions 34 and between the intermediate portions 34 and ends 22 is interrupted by shallow lower or bottom cross slots 50 as best seen in FIG. 7. The lower cross slots 50 have a width along the longitudinal axis of the connector which is larger than the width of the upper cross slots 26. Thus, by way of example, while the upper cross slots 26 may be 0.072 inches in width the lower cross slots 50 may be 0.080 inches in width. As stated, the lower cross slots are shallow and may by way of example be 0.010 inches in depth. These lower cross slots define therebetween lower separators 52 best seen in FIG. 7. By way of example these lower separators may have a width of 0.02 inches.

The shallow lower cross slots 50 extend upward from the bottom surface 16 defined by the bottoms of the ends 22 and intermediate portions 34. Referring to FIG. 6 the uppermost surface of the lower cross slots is defined by a pair of recesses 52 and 54 extending upwardly into the connector body. The center-most recesses 54 define between them a lower rib 56 having a lower face 55 and side walls 58. The bottom or lower face 55 of the lower rib 56 is coplanar with the floor of the lower cross slots at the edges of the connector body as shown at 57 in FIG. 6. The laterally or generally horizontally extending portion of the connector body between the recesses 52, 54 and 48 and cross slot floors 46 provide a base section of the connector body.

Referring to FIGS. 1 and 6 the sides 18 and 20 of the connector body 10 are cut away or formed to define shallow side slots 61. These side slots may have a depth of 0.007 inches by way of example. The sides of the side slots are defined by the upper separators 32 and lower separators 52 as best seen in FIG. 7. Because the upper cross slot separators 32 have a greater width than the lower cross slot separators 52 the side slots have a lesser upper width 62 and a slightly larger lower width 64 as illustrated in FIG. 7. The change in width of the side slots occurs at the shoulder 66 which appears at the sides of the connector where the upper separators 32 join the lower separators 52.

The snap-type fasteners 28 are now described in further detail. Referring to the bottom view of the connector shown in FIG. 3 it is seen that the fasteners 28 are generally circular in periphery but have parallel cut away side faces 68. A central bore 70 extends through the fastener as well as the lower rib 56 and the upper rib 40 as seen in FIGS. 3 and 5. The fasteners are bifurcated by slots 78 which are centered on the longitudinal axis of the connector and form in each connector two legs 68. The slot 78 is of a lesser dimension than the diameter of the bore 70 as seen in FIG. 5. The fastener legs 68 are enlarged at their lower ends to form a lesser or minor diameter portion at 71 and an increased or major diameter portion at 72. The major diameter portion 72 joins a lower generally conical section 74 and an upper conical section 76. Referring to FIG. 5 it will be seen that the fastener legs 68 are attached to the connector in the recess 60 beneath the intermediate sections 34 and in the recess 40 beneath the ends 22. This provides sufficient length to the fastener legs to provide flexibility for the desired snap action.

Referring to FIGS. 11-13 there is shown a means for locking the card guide or connector fasteners 28 to a base board or busplane PCB. Six molded synthetic resin fastener pins 84 are attached to a runner or carrier 86 by arms 88 extending substantially perpendicular to the runner or carrier. The fastener pins 84 are cylindrical in shape and have reduced diameter end portions 89 connected to the main body by a chamfer portion 91 as seen in FIG. 13. The reduced diameter end portion facilitates assemblage as will be described. It will be understood that the assembly of runner or carrier 86, arms 88 and fastener pins 84 are molded as an initially unitary assemblage. By way of example the molded fastener pins may be 0.062 inches in diameter and 0.215 inches in length. Each of the six pins are located approximately 0.50 inches away from the runner and extend downwardly from it at approximately 90°. Each of the six pins are spaced at equal distances of 1.022 inches to correspond with the locations of the bores 70 of the fasteners 28 on the molded card guide or connector body. The runner is used as a loading fixture for installation of the pins and may be discarded after final assembly.

In a typical fastening of a card guide or connector according to the invention the busplane PCB may be 0.031 inches thick with a 0.062 inch thick sheet metal member that is part of the equipment chassis. The outside surface of the sheetmetal is preferably provided with countersunk 0.136 inch diameter holes on 1.022 inch spacings to accept and provide the necessary gripping action for each fastener 28. As an example the fasteners may have a minor diameter 71 of 0.125 inches and a major diameter 72 of 0.156 inches with a 0.040 wide slot in the center to create the separation between the two legs. These separated legs allow the fastener to pinch in and be installed in a hole size smaller than the 0.156 inch major diameter. Within each fastener is the bore 70 which may constitute a 0.062 inch diameter hole to accept an equal diameter fastener pin 84.

Each fastener 28 may have a 30° taper on its conical outer end 74 to allow it to be started into a nominal 0.136 inch diameter hole in the busplane PCB and chassis. Behind this tapered end is the area of major diameter 72 of 0.156 inches. This may be followed again by a 30°. taper at portion 76 to provide a surface to grip the countersunk hole surface in the sheetmetal. Because the contact legs on the underside of the card guide generate pressure that could possibly lift the card guide assembly away from the busplane circuit pads the locking fastener pins 84 are installed into each fastener. These pins acts as wedges within each fastener 28 to eliminate any possible flexing of the fastener legs that would let the fastener out of the countersunk hole.

The procedure for locking the card guide or connector into position is as follows: The six fastener pins 84 are positioned on their attached runner 86 above the top side of each card guide assembly 10 above the fastener bores 70. The pins 84 are then lowered into each corresponding hole or bore 70 as far as free movement permits. At this time the runner 86 is tipped upward while applying a downward pressure to the pins. In this upright position the entire runner 86 is pressed downward to push each of the six pins 84 farther down into the card guide fastener holes. At this point the pins 84 generally have broken free of the runner 86. If not, the runner is tipped slightly from side to side until the pins break free and the runner may then be discarded. The final step is to push the pins 84 farther down into each bore 70 until the leading end of the pin 84 is flush with the countersunk hole surface of the sheetmetal. The fasteners 28 and card carrier or connector 10 is then locked to the busplane PCB and chassis.

Referring to FIGS. 8 and 9 the electrical contacts are now described. Each contact may preferably be formed of beryllium copper and may for example have a thickness of 0.006 inches. Each contact 90 has a U-shaped base portion 92 comprising an upper leg 94, lower leg 96 and bight 98. Extending from the left end of the upper leg 94 in FIG. 8 is an upstanding contact arm 100 which is canted at an angle 101 from perpendicular to leg 94. The angle 101 may be for example 5-9°. The arm 100 is provided with a dome-shaped contact point 102 while the lower leg 96 is provided with a dome shaped contact point 104. The bottom dome 104 provides a solderless pressure connection point to a circuit trace or pad on a busplane PCB. The top dome contact point 102 provides a pressure connection point to a circuit pad on a modular plug-in PCB. In addition to the two domed contact points each contact 90 has two locking lances, fingers or barbs 106 and 108 struck from opposite sides of the upper and lower legs 94 and 96 respectively. By way of example the U-shaped base portions of the contacts may be 0.069 inches wide and the contact legs may be 0.200 inches long. The upstanding arm 100 is preferably of a lesser width than the U-shaped portion and by way of example may be 0.062 inches wide and 0.150 inches high. As stated the thickness of the contact metal may be 0.006 inches.

Figure 15:
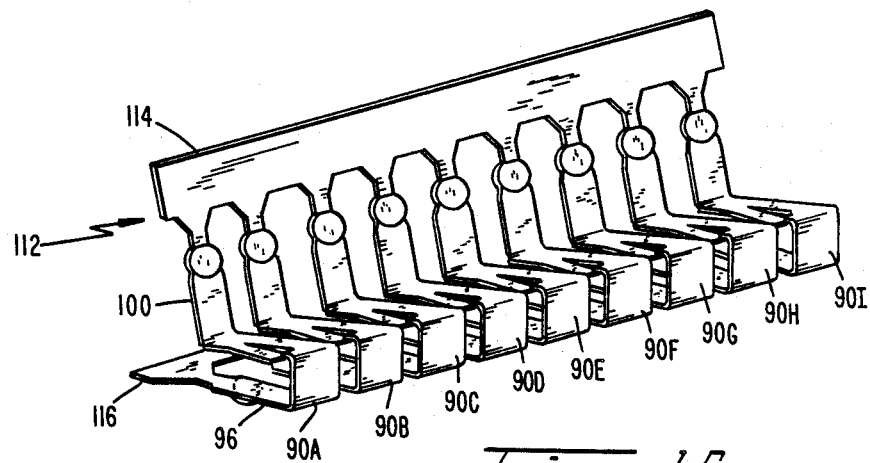
FIG. 15 is a perspective view of a contact subassembly comprising nine contacts prior to mounting on the connector.

The molded card guide or connector which has been described by way of example has specific segments of nine dual contact positions on 0.100 inch centerline spacing. To match these segments the electrical contacts 90 may be produced in segments of nine contacts also on 0.100 inch spacing. This may be accomplished by way of example by providing the segments of nine contacts with breakaway carrier strips formed from the contact metal. Such a subassembly is illustrated at 112 in FIG. 15. In that figure it is seen that nine electrical contacts 90A–90I are held between breakaway carrier strips 114 and 116. The carrier strip 114 is attached near the top of the upstanding leg 100 of each contact and the carrier strip 116 is attached at the end of the lower leg 96 of each contact.

To load the contacts onto the card guide or connector body a subassembly 112 of nine contacts is positioned on either side of the molded card guide or connector body. Using finger pressure or suitable assembly apparatus the subassembly of nine contacts may be pushed into an appropriate segment of slots in the card guide or connector until the contacts bottom out with the connector body abutting against the contact bights and the locking fingers, lances or barbs 106 and 108 snap into locking position in their respective recesses 48 and 52. Once the contacts are locked into place the carrier strips 114 and 116 may be deflected and broken off and discarded. This loading process may be repeated until all required segments are filled. Should selective contact loading be desired within a segment, contacts may be separated individually into nine loose contact elements and hand loaded individually. Each contact need only be pressed onto the connector body until it seats and the locking lances are heard to snap in position. At that point the contact mounting is complete.

When a card guide or connector has been completely loaded with contacts, all of the top dome contacts 102 on both sides will protrude out into the insertion slot 26. By way of example this slot may be 0.07 inches wide as previously described. Using contacts as described the opening or spacing between contacts will be approximately 0.03 inches by way of example. Referring to FIG. 10 a cross section of the connector body is shown with contacts mounted in position on opposite sides thereof. It will be seen that the upper locking finger or barb 106 is locked into recess 48 and the lower locking finger or barb 108 is locked in recess 52. The recess 54 provides a relief pocket to permit the lower leg 96 to be deflected upwardly to provide a downward pressure connection on a corresponding circuit pad on the busplane PCB (not shown). The bight 98 bottoms on the side of the connector body within the side slot. The upper leg 94 is received in the upper cross slot between the separators 32 and the lower leg 96 is received in the lower slot between the lower separators 52. The slots are such that the contact metal is exposed but within the profile periphery of the top, bottom and side surfaces of the connector body when the connector is fastened into position. Prior to being fastened into position the contacts lie within the profile periphery of the connector body as described except that the end of the lower contact leg 94 and its dome 104 extend below the lower surface of the connector as seen in FIG. 10. Once the connector is fastened into position on a busplane PCB the lower contact leg 96 is flexed upwardly into the recess 54 so that it too lies within the periphery of the connector body.

Referring to FIG. 14 there is shown a preferred embodiment of electrical contact 90. Like reference numerals are used to indicate like parts of contact 90 illustrated in FIGS. 8 and 9. In this preferred embodiment of contact the upper leg 94 of the contact is provided with an overbend to form an acute angle between leg 94 and bight 98. This construction counteracts any tendency towards rocking motion of the entire contact when dome 104 on leg 96 is deflected upwardly when the connector is mounted on a busplane PCB. In addition this counterclockwise disposition of the leg 94 in conjunction with the angle 101 disposes the arm 100 leftwardly in FIG. 14 whereby it is possible to provide a wide range of contact pressures at dome 102.

The inward movement of the upstanding contact arm 100 is limited by the upstanding surface 44 of the upper rib 40 to provide a predetermined spacing between the domed contact points 102 on the upper arms 100. To deflect and open all of the contact points along the slot length the modular plug-in PCB's are preferably provided with an isolated chamfer along the edge that slides within the card guide or connector insertion slot 26. Such a chamfer provides the equivalent of a knife edge that allows the dome contact points to be gently opened to accept the total thickness of the plug-in card without damage. The dome contact points on the lower legs of the U-shaped portions of the contacts are positioned over the relief pockets or recesses 54 on the under side of the card guide or connector. When the card guide or connector is snapped onto a busplane PCB the contact points are deflected up into the relief pockets and provide a downward pressure connection on a corresponding circuit pad on the busplane PCB.

While the card guide or connector of the invention has been described in terms of a preferred embodiment it will be appreciated that the specific dimensions and construction described have been provided for purposes of clear illustration rather than restriction. Thus the card guide length may be modified and number of contact positions changed to accommodate specific requirements. The length of fasteners may be modified to accommodate various PCB and/or sheetmetal thicknesses. Domed contact points may be bifurcated. Bottom dome contacts may be provided with a sharp feature to provide a gas-tight connection. The bottom contacts could be substituted with a conventional mounting for soldering to a PCB. The dimensions are illustrative and not restrictive.

It will be appreciated that the guide card or connector of the invention provides a space-saving low profile to cope with space restrictions. The connector utilizes solderless contacts that require no hand tools. The contact points stay clean by way of wiping action from plug-in PCB's. The assembly of the card guides to the busplane PCB requires no hand tools.

The invention may be embodied in other specific forms without departing from the spirit or essential characteristics thereto. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A connector for interconnecting a base circuit board and a companion circuit board in substantially perpendicular relation to each other, comprising:
   (a) an elongated connector body having an insertion slot opening at the top thereof extending along the longitudinal axis of said elongated body for receiving the companion circuit board therein, and having multiple cross slots at the top thereof extending thereacross substantially perpendicular to said insertion slot;
   (b) multiple spaced snap-type fasteners attached to the underside of said elongated body and extending away from said insertion slot for fastening said connector to the base circuit board;

(c) said elongated body having formed in its underside multiple shallow cross slots aligned with said cross slots at the top of said body;

(d) a plurality of electrical contacts having a U-shaped base portion and an upstanding contact arm extending from the end of one leg of said U-shaped base portion;

(e) said electrical contacts being mounted on said elongated body with the upstanding contact arms disposed in said cross slots in pairs adjacent said insertion slot for making contact with conductors on a companion board when a companion board is inserted in said insertion slot;

(f) the legs of the U-shaped portion of the contacts engaging opposed surfaces of said elongated body within said slots to attach said contacts to said elongated body;

(g) said elongated body having shallow slots at opposed sides thereof communicating with said cross slots and said shallow cross slots, the bights of said contacts being received in said shallow side slots, said contacts being mounted on outer surfaces of said connector body whereby the outer surfaces of the U-shaped portions thereof are exposed and the outer surfaces of said upstanding contact arms are exposed;

(h) said legs of said U-shaped portions of said contacts having locking finger means struck therefrom and extending inwardly from the legs towards the bight and said U-shaped portions; said finger means engaging recesses formed in said opposed surfaces to lock said contacts to said elongated body;

(i) said snap-type fasteners having axial openings therein and fastener pins received within said openings to lock said snap-type fasteners against further inward movement to lock said connector to a base board.

2. A connector for interconnecting a base circuit board and a companion circuit board in substantially perpendicular relation to each other, comprising:

(a) an elongated connector body having top and bottom surfaces and a longitudinal axis;

(b) said elongated connector body having an insertion slot opening at the top surface thereof and having a center plane extending along the longitudinal axis of said elongated body for receiving the companion circuit board therein;

(c) said connector body having corresponding multiple cross slots at the top and bottom surfaces thereof defining multiple substantially parallel planar dividers extending above and below a base section of said connector body which extends along said axis of said connector body and outward from said center plane of said insertion slot; said base section having upper and lower surfaces;

(e) a plurality of electrical contacts each having a U-shaped base portion comprising a pair of legs and an upstanding contact arm extending from the end of one leg of said U-shaped base portion;

(f) said electrical contacts being mounted on said base section with the legs of the U-shaped base portion engaging the upper and lower surfaces of said base section and having locking finger means struck from at least one of said legs of said U-shaped base portion; said finger means having a free end engaging in a recess formed in a surface of said base section adjacent said leg from which said finger means is struck to lock said contact base portion to the base section of said connector;

(g) said electrical contacts being mounted on outer surfaces of said connector body whereby the outer surfaces of said electrical contacts are exposed; and (h) multiple snap-type fasteners attached to the bottom surface of said connector body and extending away from said insertion slot for fastening said connector to the base circuit board.

3. A connector according to claim 2 wherein said legs of said contacts have a length which exceeds the height of said upstanding arm and wherein the height of said upstanding arm is less than twice the distance between said legs.

4. A connector according to claim 2 wherein the height of said connector perpendicular to the longitudinal axis and parallel to the insertion slot is less than the width of said connector perpendicular to the insertion slot.

5. A connector according to claim 2 wherein said snap-type fasteners have axial openings therein and fastener pins in said openings to lock said snap-type fasteners against inward movement.

6. A connector according to claim 2 having locking finger means struck from each of said legs of said U-shaped base portion; each said finger means having a free end engaging in a recess formed in a surface of said base section adjacent said leg from which said finger means is struck to lock said contact base portion to the base section of said connector.

* * * * *